(12) United States Patent
Tezak et al.

(10) Patent No.: US 8,186,042 B2
(45) Date of Patent: May 29, 2012

(54) MANUFACTURING METHOD OF A PRINTED BOARD ASSEMBLY

(75) Inventors: Timothy L. Tezak, Hamilton, NJ (US); Craig F. Lapinski, Sparta, NJ (US); Jay B. Hinerman, Bridgewater, NJ (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 393 days.

(21) Appl. No.: 12/387,666

(22) Filed: May 6, 2009

(65) Prior Publication Data

US 2010/0282498 A1 Nov. 11, 2010

(51) Int. Cl.
*H05K 3/36* (2006.01)
(52) U.S. Cl. .............. 29/830; 29/832; 29/840; 438/107; 438/124
(58) Field of Classification Search .................... 29/825, 29/830, 832, 940; 438/107, 124
See application file for complete search history.

(56) References Cited

U.S. PATENT DOCUMENTS

| | | | |
|---|---|---|---|
| 5,629,242 A | 5/1997 | Nagashima et al. | |
| 5,837,155 A | 11/1998 | Nagaki et al. | |
| 5,837,427 A | 11/1998 | Hwang et al. | |
| 6,192,591 B1* | 2/2001 | Hellstern | 30/345 |
| 6,429,132 B1 | 8/2002 | Haskell et al. | |
| 2003/0116843 A1* | 6/2003 | Iijima et al. | 257/700 |
| 2004/0203193 A1* | 10/2004 | Ooi et al. | 438/118 |
| 2006/0003495 A1* | 1/2006 | Sunohara et al. | 438/124 |
| 2006/0014327 A1* | 1/2006 | Cho et al. | 438/125 |
| 2006/0054352 A1* | 3/2006 | Ryu et al. | 174/260 |

* cited by examiner

*Primary Examiner* — Carl Arbes
(74) *Attorney, Agent, or Firm* — Dilworth & Barrese, LLP; Leo G. Lenna; Daniel J. Long

(57) ABSTRACT

The present invention provides a printed wiring board assembly having active and passive components embedded between the printed wiring board layers and associated fabrication method so as to complete a multilayer printed wiring board to improve the flexibility of circuit layout.

11 Claims, 6 Drawing Sheets

MANUFACTURING METHOD OF A PRINTED BOARD ASSEMBLY

FIELD OF THE INVENTION

The invention relates to a multilayer printed wiring board and provides a technique related to a multilayer printed wiring board capable of having improved electrical characteristics and reliability, decreased overall size, weight and cost and increased surface real estate for additional components on the printed wiring board.

DESCRIPTION OF THE RELATED ART

As electronic products are being made smaller and lighter, represented by the trends of smaller, thinner, higher-density, packaged, and portable products, so also is the multilayer printed circuit board (PCB) undergoing a trend towards finer patterns and smaller and packaged products. Accordingly, along with changes in the raw materials for forming fine patterns on the multilayer printed circuit board (PCB) and for improving reliability and design density (the number of chips mounted on a single circuit board or substrate), there is a change towards integrating the layer composition of circuits. Components are also undergoing a change from DIP (dual in-line package) types to SMT (surface mount technology) types, so that the mounting density is also being increased.

Generally, a method of packaging semiconductor chips on PCBs may include one or more of the following features. For example, a semiconductor chip may be stacked on the PCB, bonded and connected by a metal wire, or connected to the PCB using various direct mounting techniques that are well-known, including for example, flip-chip mounting (FC), direct chip attach (DCA), direct die attach (DDA), and flip chip on board (FCOB). These techniques usually involve the fixing of a semiconductor die to a build-up PWB substrate.

Meanwhile, as functionality required by the electronic devices increases, an increased number of functional chips must be packaged on a limited space (or "real estate") of the PCB. This demand may suffer from a problem of causing the fabricated chip modules to be bulky as the thickness of the PCB is increased by thickness of semiconductor chips packaged to the PCB.

To solve or obviate these problems, chip embedded PCB technology has been researched where the semiconductor chips are embedded inside the PCB for integration there between. However, such embedding techniques bring about the following problems.

Difficulty in depositing high temperature fired high permittivity (dielectric constant) material on chip embedded PCBs. In other words, when the high temperature fired high permittivity material is deposited on a copper clad, co fired and deposited with polymer, a treatment problem occurs because the fabricating process is performed on the copper clad, and a bending problem is generated by differences of coefficient of thermal expansion with high permittivity material during high temperature firing.

Chips are embedded through a build-up process using a substrate as a core for fabricating the chip-embedded PCBs, and in case of coreless substrate, it is difficult to manufacture the PCBs and to embed chips inside a two-layered substrate without core.

In case of many functional chips being embedded inside the PCB, a metal plated heat sink must be additionally formed to radiate the heat generated in the course of product use. Adhesive is used to adhere a plated heat sink to the substrate in manufacturing of conventional chip embedded PCBs during which substrates may be seriously compromised by generation of air bubbles, and the yield from manufacture of substrates may decrease significantly, thereby resulting in incurrence of additional manufacturing cost.

SUMMARY OF THE INVENTION

In view of the above prior art disadvantages, the object of the present invention is to provide a printed wiring circuit board (PWB) having active semiconductor devices and passive surface mount (SMT) chips embedded between PWB layers and fabricating method thereof, whereby increased surface real estate for additional components on electronic assemblies is achieved.

Another object of the present invention is to provide a printed wiring board (PWB) having active semiconductor devices and passive SMT chips embedded between PWB layers and fabricating method thereof, so as to decrease the overall size, weight and costs of electronic assemblies.

Another object of the present invention is to provide a printed wiring circuit board (PWB) having active semiconductor devices and passive SMT chips embedded between PWB layers and fabricating method thereof, so as to increase the electrical functions and electrical performance of electronic assemblies.

To achieve the above objects, a printed wiring circuit board (PWB) having active semiconductor devices and passive SMT chips embedded between PWB layers in the present invention includes: a first circuit board panel consisting of one or more layers, where the embedded components are installed using regular component assembly processes; additional "partially cured or pre-impregnated" panel layer(s) with openings used to create cavities; additional "solid or core" circuit board panel layers with openings used to create cavities can also be used. The openings in this layer(s) provide clearance for the components installed on the above "first circuit board panel". The openings can be any shape and can provide clearance for one or more components; a second circuit board panel consisting of one or more layers. This second panel is used to cover the embedded components cavities; components, that will be embedded inside the final circuit board; and solder used for installing the embedded components using well known SMT Assembly processes.

The present invention also discloses a method of fabricating a printed wiring board having active semiconductor devices and passive SMT chips embedded therein contains the following steps: providing a carrier board comprised of a plurality of core and pre-impregnated layers; installing one or more embedded components onto a support layer; building up cavities around the one or more installed embedded components using additional core and pre-impregnated layers; installing further core and pre-impregnated layers above the built up cavities to form a PWB assembly; and laminating the PWB assembly thereby causing the cavities to backfill with lamination.

The above method further comprises processing all layers under heat, pressure and vacuum.

The present invention discloses a printed wiring board structure having active semiconductor devices and passive surface mount (SMT) chips embedded between PWB layers and fabricating method thereof further comprise embedding surface mount structures thereto, so as to complete a multi-layer circuit board, to improve the flexibility of circuit layout.

Moreover, in the present invention, the circuit board having capacitors embedded therein and fabricating method thereof can avoid alignment errors during drilling and lamination in the conventional method. Therefore, quality of products is advanced, and fabricating method is simplified to decrease the production cost.

Other objects, advantages, and novel features of the invention will become more apparent from the following detailed description when taken in conjunction with the accompanying drawings.

BRIEF DESCRIPTION OF THE DRAWINGS

These and other objects, features and advantages of the invention will be apparent from a consideration of the following Detailed Description Of The Invention considered in conjunction with the drawing Figures, in which.

DETAILED DESCRIPTION OF THE INVENTION

Figure 1:
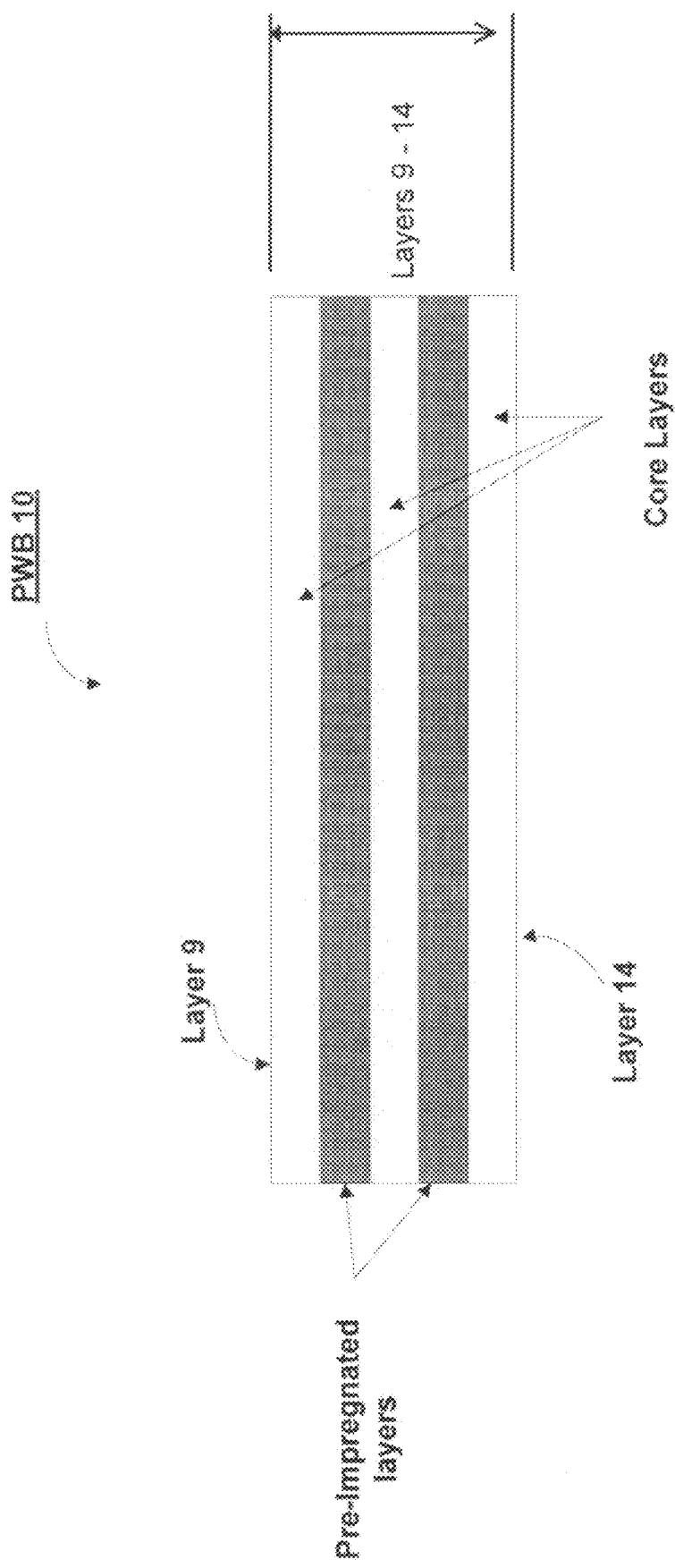
FIG. 1 is a process diagram showing the manufacturing method of the multilayer printed wiring board according to the first embodiment.

Because of the specific embodiments illustrating the practice of the present invention, a person having ordinary skill in the art can easily understand other advantages and efficiency of the present invention through the content disclosed therein. The present invention can also be practiced or applied by other variant embodiments. Many other possible modifications and variations of any detail in the present specification based on different outlooks and applications can be made without departing from the spirit of the invention.

The drawings of the embodiments in the present invention are all simplified charts, and only reveal elements relative to the present invention. The elements revealed in the drawings are not aspects of the practice, and quantity and shape thereof are optionally designed. Further, the design aspect of the elements can be more complex.

Now, exemplary implementations of the present inventive disclosure will be described in detail with reference to the accompanying drawings.

FIGS. 1 to 6 are cross-sectional views illustrating a fabricating method of passive SMT chip and semiconductor device embedded printed wiring board 10 according to one embodiment of the invention.

Referring to FIGS. 1 to 6, a partial lamination of layers 9-14 of a build-up substrate, i.e., PWB 10, is shown. PWB 10 preferably comprises a core substrate and a resin insulation layer laminated on the core substrate. Build-up PWB substrates typically include a central constraining layer or "core" to which comparatively thin dielectric layers are attached. The thin dielectric layers include fine circuit features and narrow diameter plated vias. A core can be constructed using a glass fiber based dielectric material possessing physical characteristics similar to those of glass fiber based dielectric materials used in the construction of the type of PWB on which an integrated circuit (i.e., a packaged semiconductor device) would be surface mounted. To distinguish between PWBs on which ICs are mounted and PWB substrates, the former are referred to as conventional PWBs. The thin dielectric layers in build-up PWB substrates are constructed from a class of materials that are typically not used in the construction of conventional PWBs. Specialized processing techniques are used to bond the core and the thin dielectric layers and to form the fine circuit traces and narrow diameter plated vias.

Preferably, all PWB layers in the fabricating method are of a standard panel size, 12×18, however, the present invention is not so restricted. A panel size of 12×18 is preferred because of its compatibility with standard PCB lamination and assembly equipment.

Figure 2:
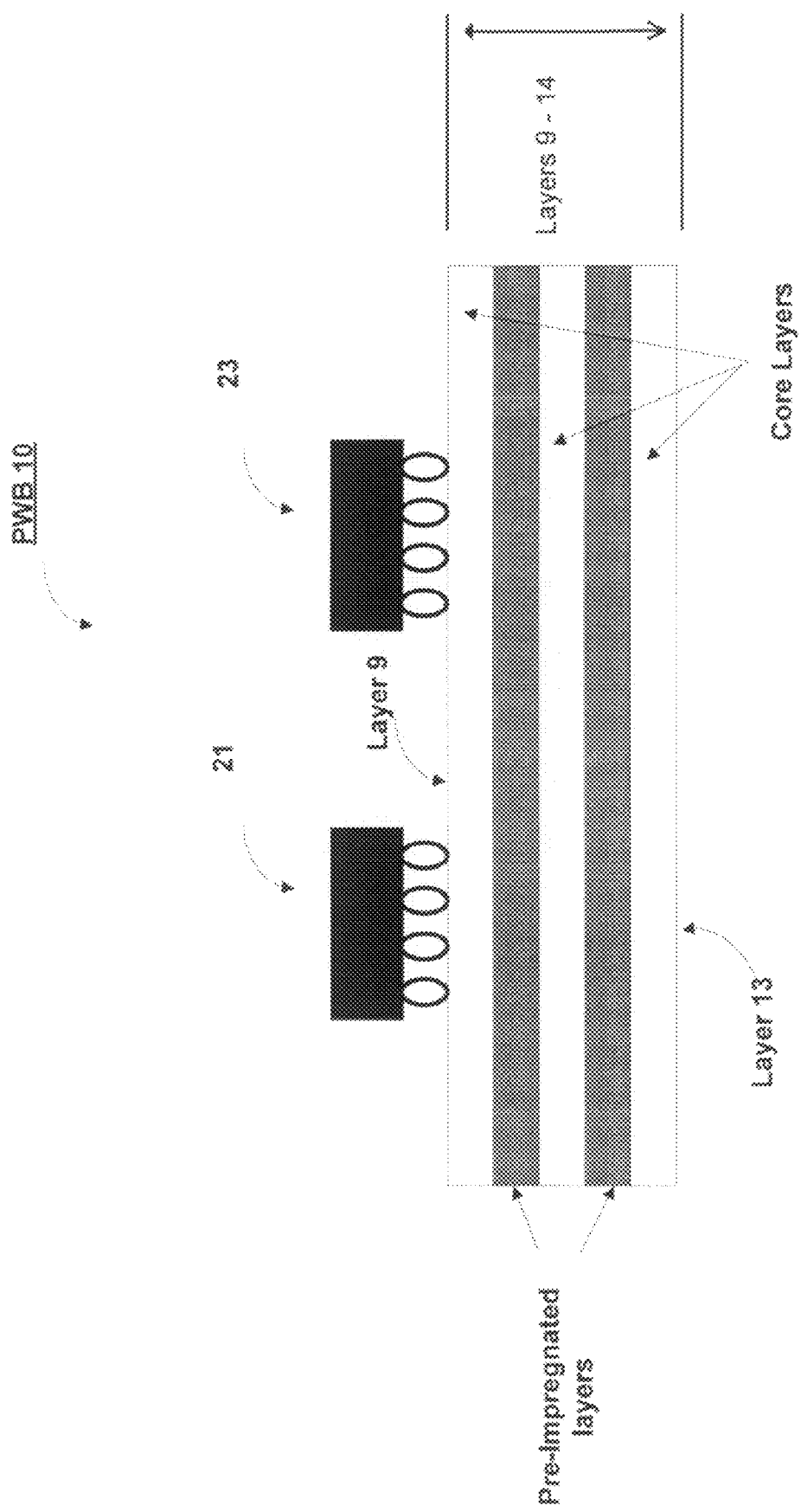
FIG. 2 is a process diagram showing the manufacturing method of the multilayer printed wiring board according to the first embodiment.

At a first stage of the fabricating method, one or more embedded components (e.g., active semiconductor devices and passive surface mount (SMT) chips) 21, 23, are successively fixed to support layer 9 of a build-up PWB substrate 10, as shown in FIG. 2. Two components 21, 23 are shown by way of example only. In one embodiment, the embedded components 21, 23 are fixed to support layer 9 using a flip-chip bonding method. Although an implementation using flip-chip bonding method for packaging the embedded components 21, 23 onto support layer 9 has been exemplified, other various methods such as, for example, wire bonding method and ACF (Anisotropic Conductive Film) method may be employed. In addition, other SMT components such as, for example, resistor, capacitors, inductors, etc. can also be installed using regular SMT assembly processes. The reader will now be aware of still other SMT components contemplated by the invention, including future and envisioned components, suitable for use with the invention.

Figure 3:
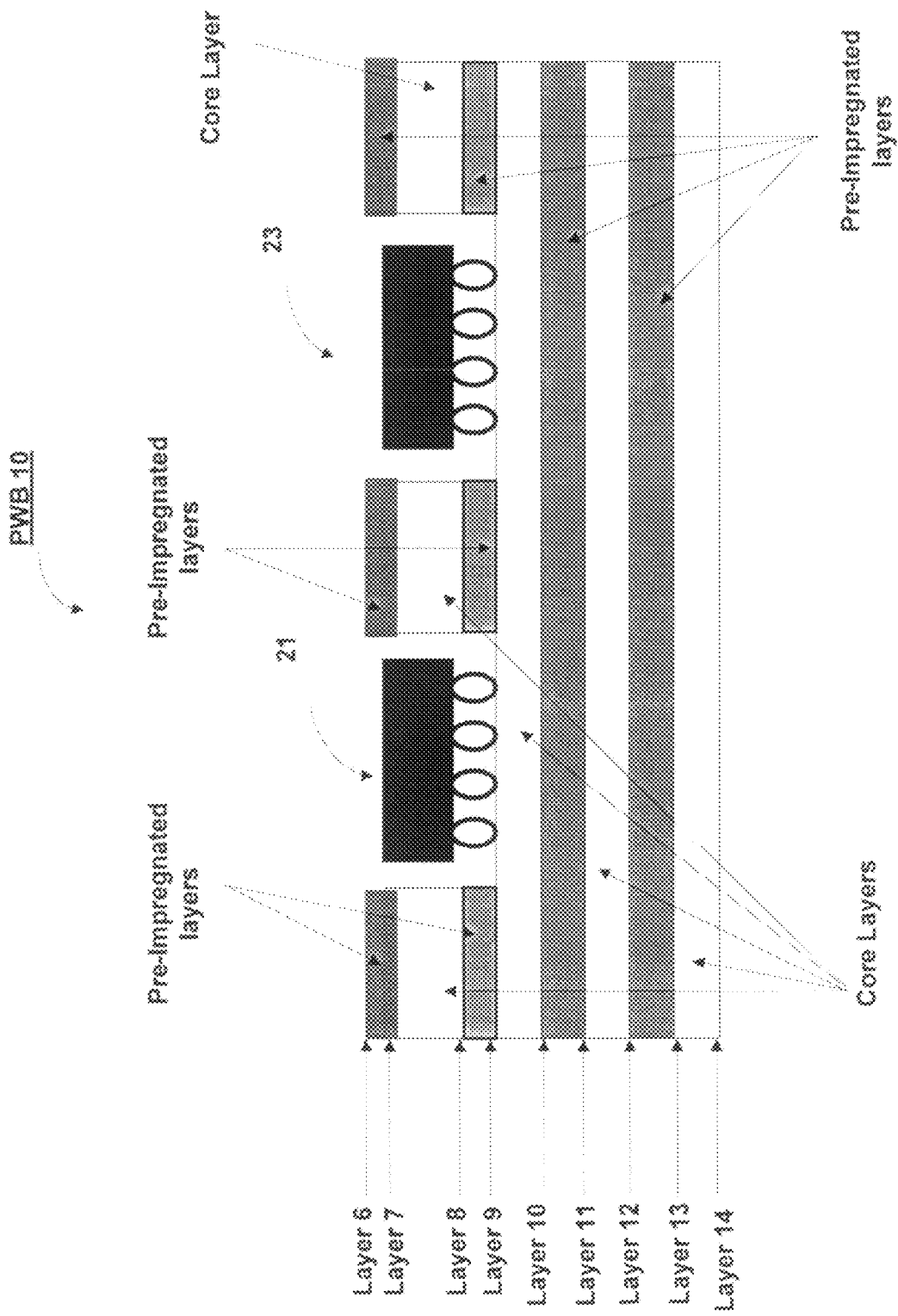
FIG. 3 is a process diagram showing the manufacturing method of the multilayer printed wiring board according to the first embodiment.

Next, cavities are built up around the components 21, 23 in order to prevent the embedded components 21, 23 from becoming damaged, as shown in FIG. 3. The cavities are built up using core and prepregnated layers 7-8. These layers are typically formed of a half-hardened pre-impregnated. The pre-impregnated layers are typically made of glass fiber hardened by a predetermined heat and pressure and thermosetting resin. Openings are cut into these layers 7-8 to create mechanical clearance around the embedded components 21, 23. The openings can be any shape and can provide clearance for the embedded components 21, 23 when the regular production layers 1-6 are stacked above layer 7 to cover the embedded components 21, 23.

Figure 4:
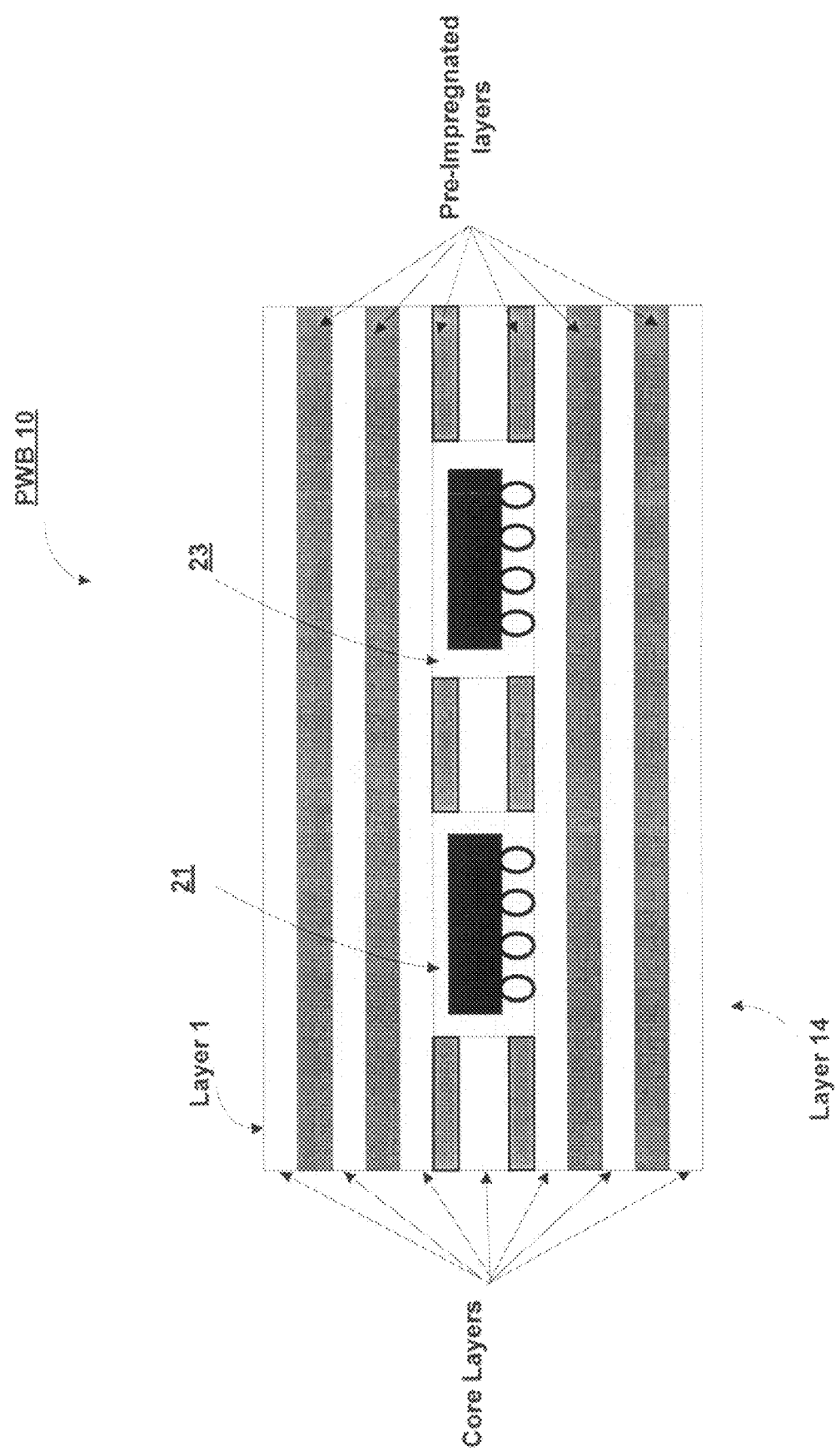
FIG. 4 is a process diagram showing the manufacturing method of the multilayer printed wiring board according to the first embodiment.

Next, regular production layers 1-6 are stacked above layer 7 to cover the embedded components 21, 23, as shown in FIG. 4. Layers 1-6 can be individual layers or layers 1-6 can be pre-laminated as a lamina before being stacked above layer 7.

Figure 5:
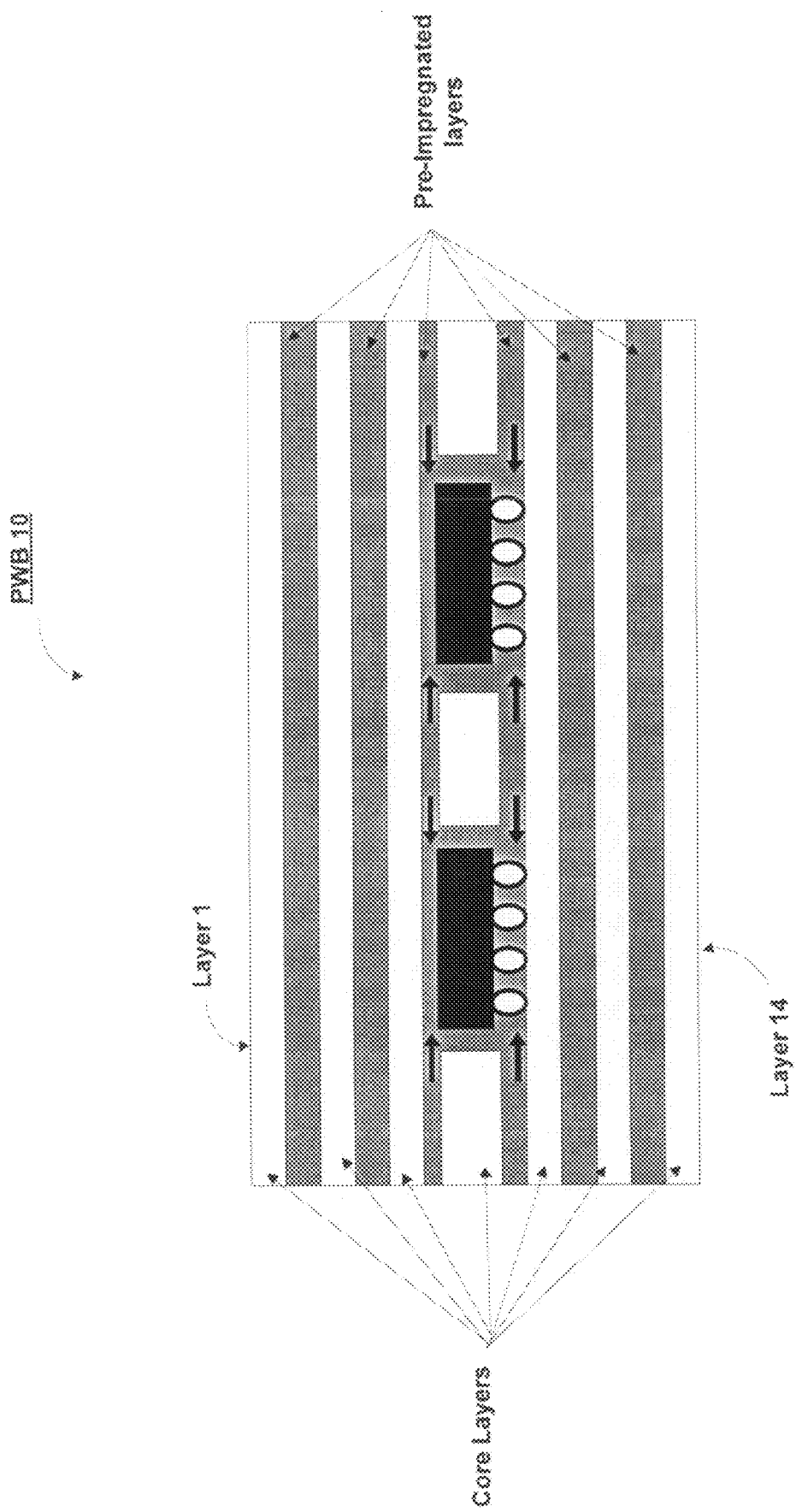
FIG. 5 is a process diagram showing the manufacturing method of the multilayer printed wiring board according to the first embodiment.

FIG. 5 shows a final lamination process during which epoxy from pre-pregnated layers backfill the cavities. During this step all layers 1-14 are permanently bonded using regular production processing conditions for FR4 core and pre-pregnated layers. A vacuum is used to pull air from the cavities which cause the cavities to become filled with residual resin/materials from pre-pregnated layers to avoid voids, gaps, bubbles which are common defects in printed circuit boards.

Figure 6:
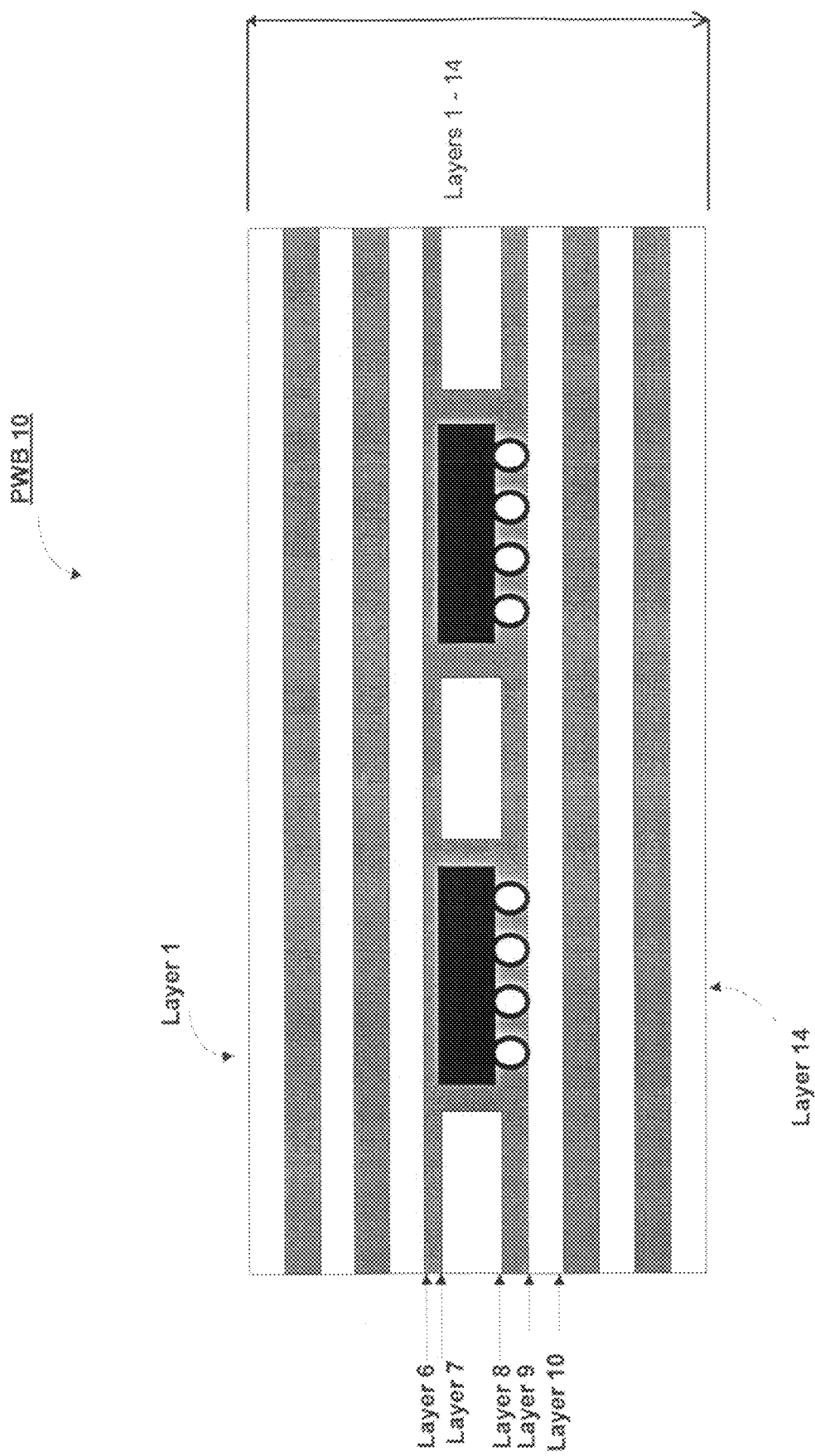
FIG. 6 is a process diagram showing the manufacturing method of the multilayer printed wiring board according to the first embodiment.

FIG. 6 shows a completed PWB 10 according to embodiments of the present invention. All layers 1-14, i.e., core and dielectric (e.g., pre-impregnated) layers 1-14 have been laminated and bonded. Signal plane assemblies may also be formed using other dielectric layers other than a pre-impregnated dialectric layer and still be within the scope of the present invention.

It should be understood that the embodiment described above is exemplary and that the layers are numbered for reference only. According to the invention, the number of layers required to build up the cavities is dependent upon the clearance required for embedding components and the thickness of these layers. A minimum number of layers to build up the cavities is one and a maximum number of layers is dependent upon the cavity thickness and layer thickness.

According to the instant inventive concept, a printed wiring circuit board (PWB) having active semiconductor devices and passive SMT chips embedded between PWB layers is provided.

The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments, not explicitly defined in the detailed description.

What is claimed is:

1. A manufacturing method of a printed wiring board assembly, the method comprising:
    providing a carrier board comprising a plurality of core and pre-impregnated layers;
    installing one or more components onto a support layer of said carrier board, wherein the one or more components are electrically coupled to the carrier board;
    building up cavities around the one or more installed components using at least a first set of additional core and pre-impregnated layers;
    installing at least a second set of additional layers above the built up cavities to embed said one or more components to form a printed wiring board assembly; and
    laminating the printed wiring board assembly thereby causing the cavities to backfill with lamination.

2. A method according to claim 1, wherein the plurality of core and pre-impregnated layers of said carrier board are juxtaposed in an alternating sequence.

3. A method according to claim 1, wherein the first set of additional layers comprise a plurality of core and pre-impregnated layers.

4. A method according to claim 3, wherein the core and pre-impregnated layers comprising said first set of additional layers are juxtaposed in an alternating sequence.

5. A method according to claim 1, wherein the second set of additional layers are laminated as a lamina prior to being installed onto said support layer of said carrier board.

6. A method according to claim 3, wherein the core and pre-impregnated layers are juxtaposed in said lamina in an alternating sequence.

7. A method according to claim 1, wherein the second set of additional layers are a combination of core and pre-impregnated layers.

8. A method according to claim 1, wherein the step of building up cavities around the one or more installed components using said first set of additional layers, further comprises:
    (i) creating openings in the first set of additional layers; and
    (ii) installing said first set of additional layers including said created openings onto said support layer.

9. A method according to claim 1, wherein said components comprise active semiconductor devices.

10. A method according to claim 1, wherein said components comprise passive surface mount chips.

11. A method according to claim 1, wherein said step of laminating the printed wiring board assembly thereby causing the cavities to backfill with lamination further comprises: using a vacuum to pull air from said cavities to cause said cavities to become filled with residual resin/material from said pre-impregnated layers.

* * * * *